United States Patent
Yee

[19]

[11] Patent Number: 5,463,658
[45] Date of Patent: Oct. 31, 1995

[54] LOW IMPACT COLLISION DETECTION METHOD

[75] Inventor: Dawson L. Yee, Beaverton, Oreg.

[73] Assignee: Intel Corporation, Santa Clara, Calif.

[21] Appl. No.: 216,668

[22] Filed: Mar. 23, 1994

[51] Int. Cl.⁶ ........................................................ H04B 3/00
[52] U.S. Cl. ............................................. 375/257; 370/85.2
[58] Field of Search ........................ 375/7, 36; 395/275, 395/325; 370/85.2; 307/266

[56] References Cited

U.S. PATENT DOCUMENTS

| | | | |
|---|---|---|---|
| 4,390,944 | 6/1983 | Quackenbush et al. | 364/200 |
| 4,736,124 | 4/1988 | McFarland, Jr. | 307/471 |
| 4,756,006 | 7/1988 | Rickard | 375/36 |
| 4,825,402 | 4/1989 | Jalali | 375/36 |
| 4,860,309 | 8/1989 | Costello | 375/36 |
| 5,003,467 | 3/1991 | Donaldson et al. | 364/200 |
| 5,056,110 | 10/1991 | Fu et al. | 375/36 |
| 5,070,449 | 12/1991 | Dawson et al. | 395/325 |
| 5,086,427 | 2/1992 | Whittaker et al. | 370/85.1 |
| 5,097,483 | 3/1992 | Bechtolsheim | 375/17 |
| 5,109,493 | 4/1992 | Banerjee | 395/325 |
| 5,191,656 | 3/1993 | Forde, III et al. | 395/325 |

*Primary Examiner*—Stephen Chin
*Assistant Examiner*—Kevin Kim
*Attorney, Agent, or Firm*—Blakely, Sokoloff, Taylor & Zafman

[57] ABSTRACT

A bus driver circuit having an active low-side driver and a hybrid high-side driver. When driving a logic high, the bus driver circuit delivers an active "kick" to pull the bus to a logic high state quickly and then releases the bus, allowing a weak pull-up resistor to maintain the voltage level of the bus for the remainder of the valid data phase. This kick is of limited duration, preferably lasting only long enough to bias the bus to a stable logic high while providing a remaining portion of the valid data phase that is of sufficient length for a contending bus agent to pull the bus low. The weak pull-up resistor is of sufficient size to reduce the chance that several resistors in parallel will prevent any active low-side driver of any bus agent from pulling the bus down to a low state.

18 Claims, 4 Drawing Sheets

| DATA IN | DATA OUT |
|---|---|
| 0 | 0 |
| 1 | Hi-Z (turned off) |

LOW IMPACT COLLISION DETECTION METHOD

BACKGROUND OF THE INVENTION

1. Field of the Invention

The method and apparatus of the present invention relate generally to bus contention in a bus architecture and specifically to the detection of bus contention by two or more bus agents.

2. Art Background

A standard bus architecture is often used for coupling optional hardware adapters to a bus of a computer system as bus agents. The optional hardware adapters, or bus agents, can be peripheral components such as disk drives, networks and graphics devices. A bus controller, which may be a processor, coupled to the standard bus configures and controls the bus agents by accessing the bus agents. Typically, the internal registers of the bus agents are mapped into an address space of the standard bus.

For computer systems using such a standard bus architecture, the internal registers for each bus agent are mapped to separate portions of the address space of the bus to prevent bus conflicts between the bus agents. Typically, a default address mapping for the bus agents are preselected by the manufacturers. It is therefore possible that two or more bus agents coupled to the bus may respond to the same address such that each agent will simultaneously attempt to drive data on the bus. Bus contention results.

Known prior art methods use bus contention to detect the existence of multiple bus agents at a single address so that the bus agents may be remapped into different address spaces. To ensure a predictable outcome for a collision where a first bus agent attempts to drive the bus high and a second bus agent attempts to drive the bus low, the standard bus architecture implements "open collector" bus driver circuits that includes an active pull-down driver and a pull-up device, e.g. a resistor or a field effect transistor (FET) coupled as a resistor. FIG. 1A shows a typical prior art open collector bus driver circuit. The bus driver circuit includes an active pull-down driver 1 that is enabled and disabled in response to the state of the input data received via signal line 3. As shown in FIG. 1B, if DATA IN is a logic 0, the active pull-down driver is enabled and pulls down the bus via signal line 4 such that DATA OUT is a logic 0. If DATA IN is a logic 1, the active pull-down driver 1 is disabled, and the bus is pulled up to VCC through the action of the pull-up resistor 2 shown in FIG. 1A. This bus driver circuit is intended to guarantee that a bus agent driving low data will always win a bus contention.

At start-up, the bus host attempts to identify each bus agent by sequentially broadcasting addresses and requesting identification information from any bus agent that will respond to the address. Typically, the amount of data placed on the bus in response to a self-identification request is sufficient to statistically guarantee that two bus agents will drive different data if contention occurs. Because the low data always wins, a protocol or other predictive method can be implemented to detect errors in the expected data stream. Thus, the existence of an unknown bus agent can be detected.

While the use of the pull-up resistor typically guarantees that the low driving bus agent will always win the contention, the pull-up resistor results in degraded bus performance because the valid data phase must be lengthened to account for the slow charge-up time of the bus. The trade-off is thus between system reliability and system speed. The bus speed can be increased by reducing the resistance of the pull-up resistor so that it will pull up the data line more quickly. Although this is an attractive solution for an individual bus agent, it can have system-wide repercussions if the bus is coupled to numerous bus agents containing small value resistors as pull-up devices. The effective resistance of the bus that is presented to a bus agent becomes very small due to the small value resistors of the bus driver circuits being in parallel. If the resistive value is too small, it may be impossible for an active pull-down driver to pull down the bus to the low voltage, leading to invalid or indeterminate data being read by the requesting bus host or agent. Furthermore, the reliability of the active pull-down driver can be degraded due to excessive current flow through it.

SUMMARY AND OBJECTS OF THE INVENTION

Therefore, it is one object of the present invention to provide a bus driver circuit that increases the speed of the bus over typical prior art open collector bus driver circuits.

A further object of the present invention is to increase the reliability of data transmitted via a bus.

These and other objects of the invention are provided by bus driver circuit for transmitting data on a bus in response to a data signal. The bus driver circuit includes an active driver for biasing the conductor to a first voltage level when the data signal is in a first state and for biasing the conductor to a second voltage level for a portion of a time when the data signal is in a second state. The bus driver circuit further includes a resistive element for biasing the conductor for the remainder of the time when data signal is in the second state if no bus agent coupled to the conductor attempts to bias the conductor to the first voltage level for the remainder of the time when the data signal is in the second state. The resistive element preferably acts as a weak pull-up device. The bus driver circuit thus provides an active "kick" for quickly biasing the bus to the second voltage level when the data signal is in the second state while simultaneously reducing the duration of contention between bus agents that include the bus driver circuit. The bus driver circuit further insures that the bus agent that is attempting to bias the conductor to the first voltage level will be successful.

BRIEF DESCRIPTION OF THE DRAWINGS

The objects, features, and advantages of the method and apparatus of the present invention will be apparent from the following detailed description of the invention in which.

DETAILED DESCRIPTION OF THE INVENTION

According to the preferred embodiments, a bus driver circuit having an active low-side driver and a hybrid high-side driver is disclosed. When a bus agent is driving a logic high, the bus driver circuit of the bus agent delivers an active "kick" to pull the bus to a logic high level quickly and then stops driving the bus, allowing a weak pull-up resistor to maintain the voltage level of the bus for the remainder of the valid data phase. This kick is of limited duration, preferably lasting only long enough to charge the bus to a logic high level while providing a remaining portion of the valid data phase that is of sufficient length for a contending bus agent to pull the bus low. The weak pull-up resistor has a large resistive value sufficient to reduce the chance that several resistors in parallel will prevent any active low-side driver of another bus agent from pulling the bus down to a low state. The large resistive value of the weak pull-up resistor also reduces the possibility that an active low-side driver will draw excessive current.

Figures 1A, 1B:
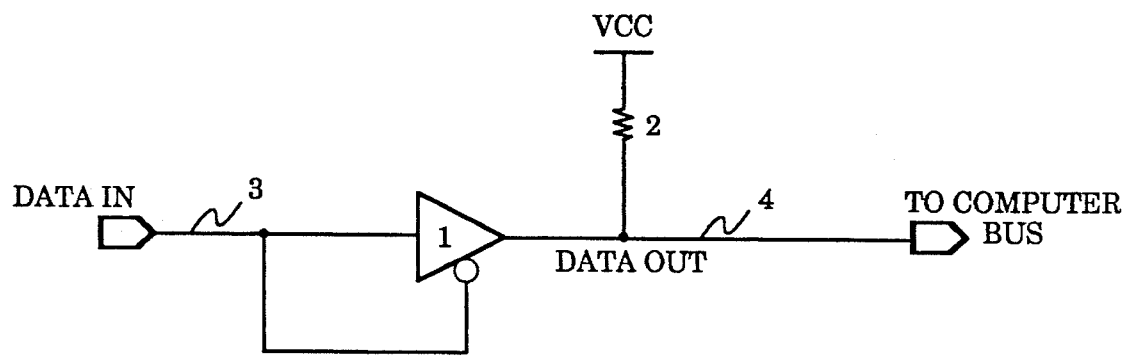
FIG. 1A shows a typical prior art open collector bus driver circuit.
FIG. 1B is a table representing the operating characteristics of a typical prior art open collector bus driver circuit.
Figure 2:
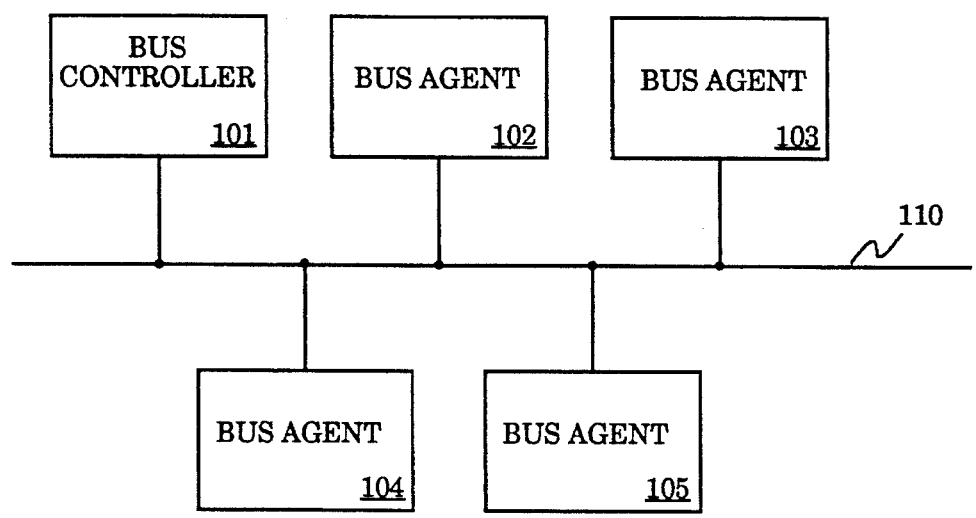
FIG. 2 shows a computer system that implements one embodiment of the present invention.

FIG. 2 shows a computer system of one embodiment of the present invention. The computer system includes a bus 110 to which is coupled a bus controller 101, and bus agents 102, 103, 104 and 105. The bus controller 101 may be a processor. The bus agents may be, for example, a disk drive controller, a network controller, a graphics controller or another bus controller. Each of the bus agents 102–105 contains a set of internal registers mapped to an address space of bus 110. Each bus agent preferably includes a bus driver circuit according to the present invention.

Bus 110 preferably includes a plurality of address lines, e.g. twenty-four, for transmitting addresses and a plurality of data lines, e.g. thirty-two, for transmitting data. Each data and address line is a conductor that is coupled to each bus agent. Data and addresses are transmitted on the bus by varying the voltage level of each conductor. When the processor 101 addresses a bus agent and requests data, the bus agent responds by simultaneously driving 32 bits of data on the bus. The duration of the transmission is determined by the length of the valid data phase, which is the time the bus must be biased to a "stable" voltage level before the data is sampled. For the purposes of illustration, the figures exemplifying the embodiments and the discussion explaining the specific implementation of the embodiments will be confined to a one-bit wide bus driver circuit that is coupled to a single data line. Accordingly, it will be recognized that a bus driver circuit and a computer system according to illustrative embodiments may be practiced without the specific details disclosed in the specification and that details are offered for illustrative purposes only.

Figure 3:
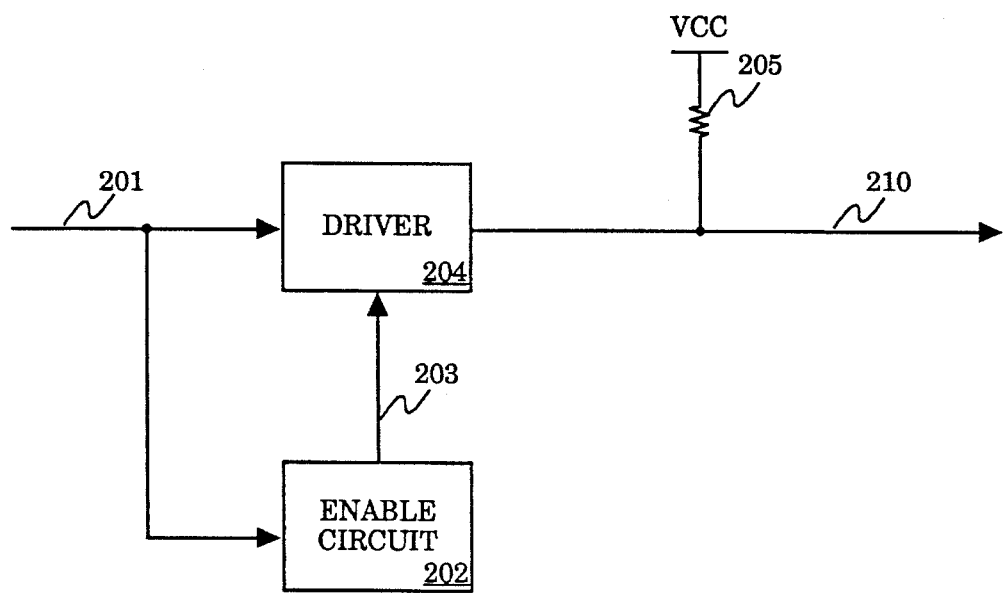
FIG. 3 illustrates a first embodiment of the bus driver circuit.

FIG. 3 illustrates a bus driver circuit according to one embodiment. The bus driver circuit 200 includes an enable circuit 202, a driver 204 and a resistive element 205. The bus driver circuit 200 is preferably included in the hardware of the bus agent component and is coupled to receive data from the bus agent via signal line 201. The resistive element 205, which is shown as a resistor, may be a resistor or a FET coupled as a resistor. The bus driver circuit 200 is coupled to transmit data on the bus via signal line 210.

The active kick for high data is produced by controlling when the driver 204 is enabled. The enable circuit 202 provides this control by generating an enable signal that is received by the driver 204 via signal line 203. When the enable signal is active, the driver 204 biases the bus in response to the data signal received via signal line 201. If the data signal is a logic 0, the enable signal goes active and remains active such that the driver 204 actively pulls the bus to a logic low voltage for the entire valid data phase. If the incoming data is a logic 1, the enable signal goes active only temporarily such that the driver 204 actively pulls the bus high for a short period and releases the bus for the remainder of the valid data phase. The period of time t is preferably of sufficient duration to allow the driver 204 to bias the bus to a stable valid logic high state. If no other bus agent is attempting to drive low data, the pull-up resistor 205 maintains the voltage level of the bus at a logic high voltage value for the remainder of the valid data phase. The resistive element 205 is preferably a weak pull-up device. Alternatively, the active kick delivered by the driver 204 can be of shorter duration and the resistive element 205 can be stronger such that the resistive element 205 can pull-up the bus to a logic high voltage value within the same amount of time.

In either event, the speed of the bus is increased because the RC time constant of the bus due to the charging of the bus line to VCC via the resistor does not, by itself, determine the time when valid data can be guaranteed. Further, several bus agents that include the bus driver circuit 200 can be coupled to the bus without affecting the reliability of data because the effective parallel resistance is of sufficiently large value such that the electrical current can be easily sinked by the active pull-down driver of a bus agent during the valid data phase. The bus driver circuit 200 guarantees that an agent driving low data will "win" any bus contention, but it does so with a reduced impact and faster speeds over the prior art open collector bus driver circuits.

In the case where a first bus agent is driving high data and a second bus agent is driving low data, the first bus agent will be attempting to actively drive the bus high while the second bus agent attempts to drive the bus low for the duration of the active kick. To prevent physical damage to the bus driver circuits, the components of the driver circuits should be selected to endure the currents that arise during the brief contention for the bus.

Figure 4:
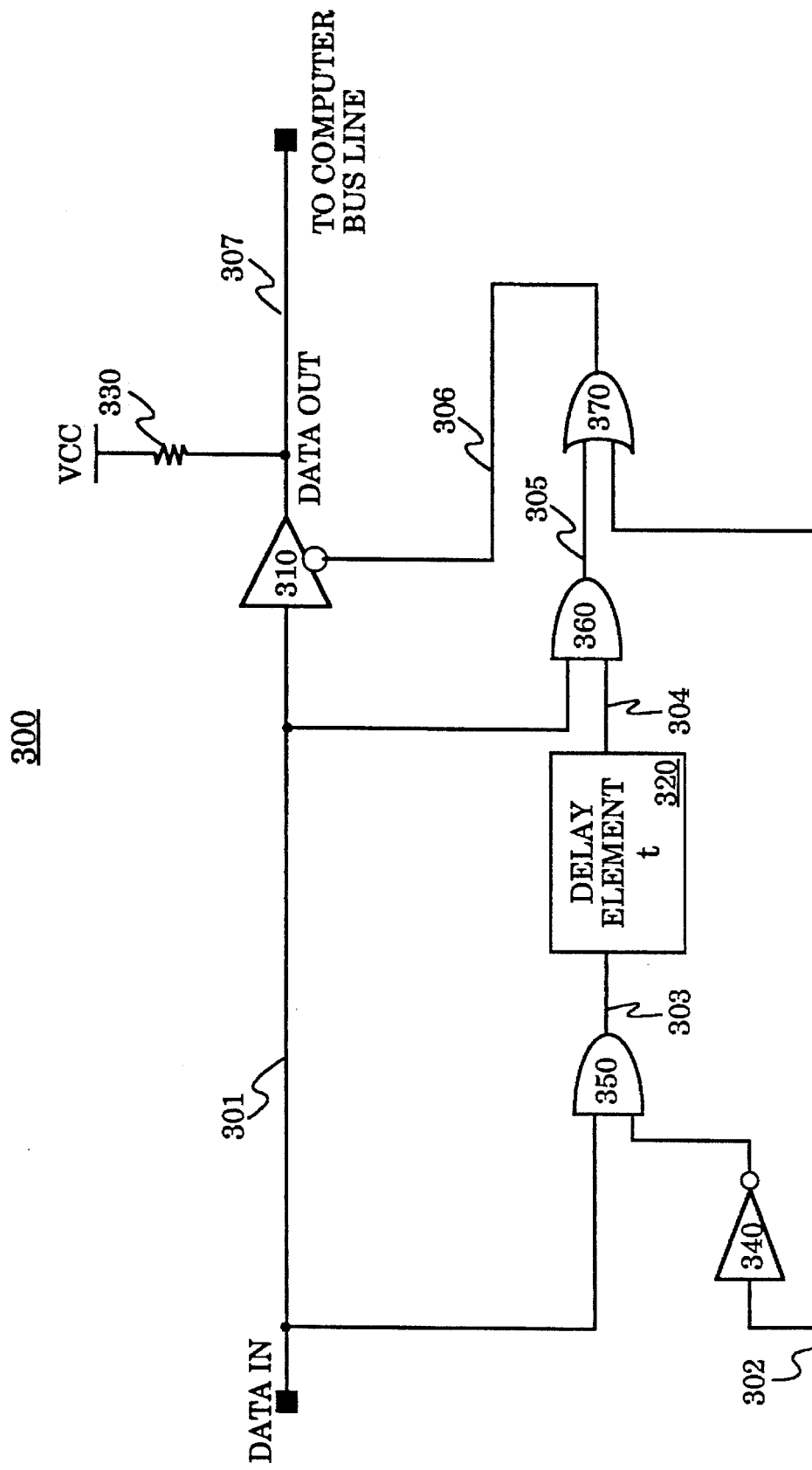
FIG. 4 shows a second embodiment of the bus driver circuit.

FIG. 4 shows a bus driver circuit according to another embodiment. The bus driver circuit 300 of a first bus agent (FIG. 2) is selectively enabled to transmit data on the bus (FIG. 2) in response to receiving a request from the bus controller (FIG. 2) or a second bus agent (FIG. 2). When the first bus agent is addressed and data is requested, the bus agent enables the bus driver circuit 300 by delivering an active low drive signal via signal line 302. Once the drive signal (signal line 302) goes low, the driver 310 will be enabled and disabled in response to the data received via signal line 301. The drive signal (signal line 302) remains active (low) for the duration of the valid data phase.

In the bus driver circuit 300, the enable circuit includes the inverter 340, the first AND gate 350, the delay element 320, the second AND gate 360, and the OR gate 370. The enable signal is an active low signal. The enable signal is output to the driver 310 by the OR gate 370 via signal line 306. When the drive signal of signal line 302 goes low, the inverter 340 inverts the drive signal such that the output of the first AND gate 350 at signal line 303 is determined by the input data. The inverter 340 also insures that, prior to the drive signal going low, the output of the second AND gate 360 is low because the input signal to the delay element 320 at signal line 303 is a logic low. Thus, when the drive signal (signal line 302) first goes low, the driver 310 is initially enabled. To guarantee that the driver 310 is initially enabled, the period between consecutive valid data phases is preferably greater than the delay time of the delay element 320.

If the data is logic low, the driver circuit 300 will remain enabled for the duration of the valid data phase because the input signals to the OR gate 370 at signal lines 302 and 305 are low. Driver 310 actively pulls the bus towards ground via signal line 307. If the data is logic high, the driver circuit 300 is enabled for a time t, after which the output of the delay element 320 goes high, causing both inputs of the second AND gate 360 to be high such that the second AND gate 360 outputs a logic high to the OR gate 370 via signal line 305. OR gate 370 generates an inactive high enable signal on signal line 306, disabling the driver 310. For the duration of the time t, the bus will be actively pulled up towards VCC via signal line 307. The pull-up resistor 330 maintains the voltage level at VCC for the remainder of the valid data phase unless another bus agent attempts to drive the bus low.

The delay element 320 can be manufactured using well known prior art techniques. For example, a string of inverters can be used where the natural propagation delay of the inverters provides the delay. Alternatively, the desired delay can be achieved using an RC circuit coupled between the output of a first CMOS buffer and the input of a second CMOS buffer. Other examples include delay lines and a clocked delay circuit. These examples are offered for illustrative purposes only, and do not in any way limit the scope of the invention.

Figure 5:
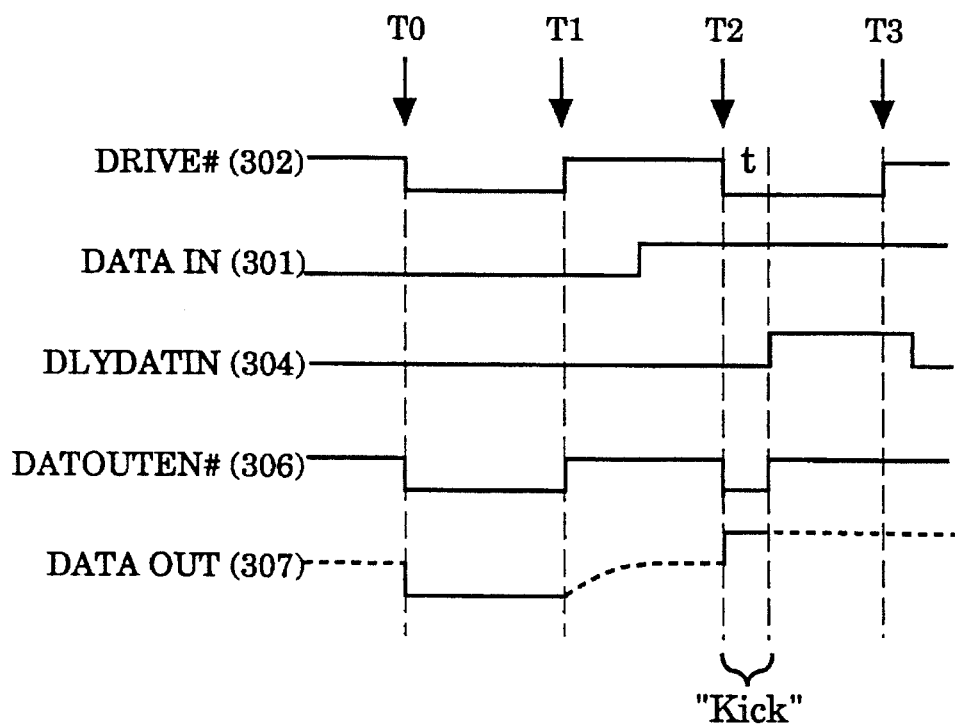
FIG. 5 is a timing diagram showing the active "kick" of the bus driver circuit.

FIG. 5 is a timing diagram showing the operation of the bus driver circuit for a first bus agent, Agent 1. The drive signal is shown by DRIVE# (active low), the input data signal is shown by DATA IN, the output signal of the delay element is shown by DLYDATIN, the enable signal of the enable circuit is shown by DATOUTEN# (active low), and the output signal of the driver circuit is shown by DATA OUT. This timing diagram illustrates a case in which the incoming data signal DATA IN changes state between valid data phases, where valid data phases are indicated by the periods of time that DRIVE# is low.

Before the beginning of the first valid data phase at time T0, DATA IN is low. When the DRIVE# signal goes low at time T0 the DATOUTEN# goes low and remains low for the duration of the period, until time T1. DATA OUT is thus low until time T1, when the driver is disabled in response to the DRIVE# signal going high. Between times T1 and T2, the input data signal DATA IN changes states from logic low to logic high, and the voltage level of the bus floats from the logic low level towards a logic high level in response to the weak pull-up action of the resistive element. This is shown by the DATA OUT signal. When the DRIVE# signal goes low at time T2, the bus driver circuit outputs a logic high, as shown by DATA OUT. At a time t after the low DRIVE# signal is received, DLYDATIN goes high, disabling the driver. The DATA OUT signal remains high, as shown by the dashed lines, in response to the weak pull-up action of the resistive element.

Figure 6:
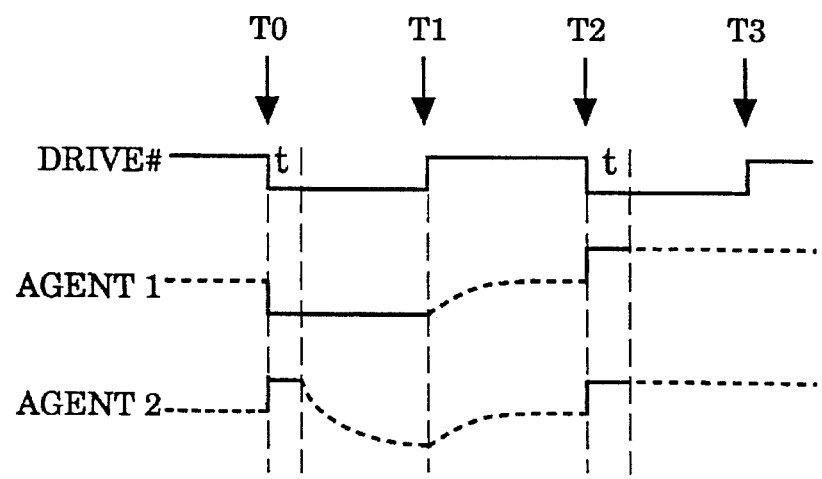
FIG. 6 is a timing diagram showing bus contention between two bus agents implementing bus driver circuits of the preferred embodiments.

FIG. 6 is a timing diagram showing bus contention between two bus agents that each include the bus driver circuit of the present invention. Agent 1 and Agent 2 are each coupled to the bus conductor (not shown) which is biased to an unknown voltage level prior to time T0. Logic low drive signals are received by both Agent 1 and Agent 2 at time T0. Such a situation may occur, for example, in a standard architecture bus where both agents occupy the same address space. Agent 1 seeks to transmit low data, while Agent 2 attempts to transmit high data. In this example, Agent 2 attempts to drive the bus conductor high for only the time t, limiting the time of actual contention. After the time t, the active pull-down of Agent 1 pulls the bus down to a low voltage such that the bus host (not shown) reads a logic low at time T1. Between times T1 and T2 neither agent is enabled, and the bus floats towards VCC in response to the weak pull-up action of the resistor (not shown). At time T2, the drive signal goes low, and the bus agents both attempt to transmit logic high data. The pull-up resistors maintain the voltage level of the bus at VCC for the remainder of the valid data phase.

In the foregoing specification the invention has been described with reference to specific exemplary embodiments thereof. It will, however, be evident that various modifications and changes may be made thereto without departing from the broader spirit and scope of the invention as set fourth in the appended claims. The specification and drawings are, accordingly, to be regarded in an illustrative rather than restrictive sense.

What is claimed is:

1. A bus driver circuit for transmitting data on a bus in response to a data signal, the bus including at least one conductor for transmitting the data signal, the bus driver circuit comprising:

a driver coupled to the conductor, the driver for biasing the conductor to a first voltage level when the data signal is in a first state, the driver for biasing the conductor to a second voltage level for a first amount of time in response to the data signal being in a second state, wherein the first amount of time is less than a second state time during which the data signal is in the second state; and a resistive element coupled to a supply voltage for biasing the conductor to at least the second voltage for a remainder of the second state time if no bus agent coupled to the conductor is attempting to bias the conductor to the first voltage level.

2. The bus driver circuit of claim 1, wherein the driver biases the conductor in response to an enable signal being active, the bus driver circuit further including:

an enable circuit coupled to the driver, the enable circuit for generating the enable signal, the enable circuit causing the enable signal to be active when the data signal is in the first state, the enable circuit for causing the enable signal to be active for the portion of the time when the data signal is in the second state.

3. The bus driver circuit of claim 2, wherein the first state corresponds to logic low and the second state corresponds to logic high.

4. The bus driver circuit of claim 3 wherein the resistive element is a resistor.

5. The bus driver circuit of claim 3 wherein the resistive element is a transistor coupled as a resistor.

6. A bus driver circuit for transmitting data on a bus in response to a data signal and a drive signal, the bus including at least one conductor for transmitting data, the bus driver circuit comprising:

a driver coupled to the conductor, the driver for biasing the conductor to a first voltage level when the drive signal is active and the data signal is in a first state, the driver for biasing the conductor to a second voltage level for a time in response to the drive signal being active when the data signal is in a second state, the time being less than a drive time when the drive signal active; and a resistive element coupled to a supply voltage for biasing the conductor to at least the second voltage for a remainder of the drive time when the data signal is in the second state if no bus agent coupled to the conductor is attempting to bias the conductor to the first voltage level.

7. The bus driver circuit of claim 6, wherein the driver biases the conductor in response to an enable signal being active, the bus driver circuit further including:

an enable circuit coupled to the driver, the enable circuit for generating the enable signal, the enable circuit causing the enable signal to be active when the drive signal is active and the data signal is in the first state, the enable circuit for causing the enable signal to be active for the time in response to the data signal being in the second state.

8. The bus driver circuit of claim 7, wherein the first state corresponds to logic low and the second state corresponds to logic high.

9. The bus driver circuit of claim 8 wherein the resistive element is a resistor.

10. The bus driver circuit of claim 8 wherein the resistive element is a transistor coupled as a resistor.

11. The bus driver circuit of claim 8, wherein the enable circuit comprises:

an inverter coupled to receive the active drive signal, the inverter for outputting an inverted drive signal;

a first AND gate coupled to receive the data and the inverted drive signal, the first AND gate for outputting a first signal;

a delay element coupled to receive the first signal, the delay element for outputting a delayed first signal;

a second AND gate coupled to receive the data and the delayed first signal, the second and gate for outputting a second signal;

an OR gate coupled to receive the active drive signal and the second signal, the OR gate for outputting the enable signal.

12. A computer system, the computer system comprising:

a bus including at least one conductor for transmitting data;

a bus controller coupled to the conductor;

a first bus agent coupled to the conductor, the first bus agent for transmitting data on the conductor, the first bus agent further including a bus driver circuit for transmitting data on the conductor in response to a data signal and a drive signal, the bus driver circuit comprising:

a driver coupled to the conductor, the driver for biasing the conductor to a first voltage level when the drive signal is active and the data signal is in a first state, the driver for biasing the conductor to a second voltage level for a time in response to the drive signal being active when the data signal is in a second state, the time being less than a drive time when the drive signal active; and a resistive element coupled to a supply voltage for biasing the conductor to at least the second voltage for a remainder of the drive time when the data signal is in the second state if no bus agent coupled to the conductor is attempting to bias the conductor to the first voltage level.

13. The computer system of claim 12, wherein the driver biases the conductor in response to an enable signal being active, the bus driver circuit further including:

an enable circuit coupled to the driver, the enable circuit for generating the enable signal, the enable circuit causing the enable signal to be active when the drive signal is active and the data signal is in the first state, the enable circuit for causing the enable signal to be active for the time in response to the data signal being in the second state.

14. The computer system of claim 13, wherein the first state corresponds to logic low and the second state corresponds to logic high.

15. The computer system of claim 14 wherein the resistive element is a resistor.

16. The computer system of claim 14 wherein the resistive element is a transistor coupled as a resistor.

17. The computer system of claim 16, wherein the enable circuit comprises:

an inverter coupled to receive the active drive signal, the inverter for outputting an inverted drive signal;

a first AND gate coupled to receive the data and the inverted drive signal, the first AND gate for outputting a first signal;

a delay element coupled to receive the first signal, the delay element for outputting a delayed first signal;

a second AND gate coupled to receive the data and the delayed first signal, the second and gate for outputting a second signal;

an OR gate coupled to receive the active drive signal and the second signal, the OR gate for outputting the enable signal.

18. The computer system of claim 17, wherein the computer system includes a second bus agent coupled to the conductor having a second bus driver circuit for transmitting data on the conductor in response to a second data signal and a second drive signal, the second bus driver circuit comprising:

a second driver coupled to the conductor, the second driver for biasing the conductor to a first voltage level when the second drive signal is active and the second data signal is in a first state, the driver for biasing the conductor to a second voltage level for a time in response to the second drive signal being active when the second data signal is in a second state, the time being less than a second drive time when the second drive signal active; and a second resistive element coupled to a supply voltage for maintaining the conductor at the second voltage level for a remainder of the second drive time that when the data signal is in the second state if the first bus agent is not attempting to bias the conductor to the first voltage level.

* * * * *